(12) United States Patent
Ye

(10) Patent No.: US 12,256,570 B2
(45) Date of Patent: Mar. 18, 2025

(54) DISPLAY SUBSTRATE AND DISPLAY PANEL

(71) Applicant: Xiamen Extremely PQ Display Technology Co., Ltd., Xiamen (CN)

(72) Inventor: Yanxi Ye, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 576 days.

(21) Appl. No.: 17/679,126

(22) Filed: Feb. 24, 2022

(65) Prior Publication Data

US 2023/0238388 A1 Jul. 27, 2023

Related U.S. Application Data

(63) Continuation of application No. PCT/CN2022/074235, filed on Jan. 27, 2022.

(51) Int. Cl.
*H10D 86/40* (2025.01)
*H01L 25/16* (2023.01)
*H01L 23/00* (2006.01)
*H10D 86/60* (2025.01)

(52) U.S. Cl.
CPC ......... *H10D 86/441* (2025.01); *H01L 25/167* (2013.01); *H01L 24/29* (2013.01); *H01L 2224/73204* (2013.01); *H10D 86/60* (2025.01)

(58) Field of Classification Search
CPC .... H01L 25/167; H01L 27/124; H10D 86/441
See application file for complete search history.

(56) References Cited

U.S. PATENT DOCUMENTS

| | | | |
|---|---|---|---|
| 2021/0066432 A1 | 3/2021 | Lim et al. | |
| 2021/0217353 A1 | 7/2021 | Zhao et al. | |
| 2021/0375702 A1* | 12/2021 | Xiao | H01L 27/124 |
| 2022/0254968 A1* | 8/2022 | Sung | H01L 27/124 |
| 2022/0320056 A1* | 10/2022 | Liang | H01L 25/167 |

FOREIGN PATENT DOCUMENTS

| | | |
|---|---|---|
| CN | 110211973 A | 9/2019 |
| CN | 110568681 A | 12/2019 |
| CN | 110911393 A | 3/2020 |
| CN | 111952331 A | 11/2020 |
| CN | 112599537 A | 4/2021 |

\* cited by examiner

*Primary Examiner* — Peter M Albrecht
(74) *Attorney, Agent, or Firm* — Hemisphere Law, PLLC; Zhigang Ma

(57) ABSTRACT

A display substrate and a display panel are provided. The display substrate includes: a base including a front surface, a back surface and a side surface; a driving circuit layer disposed on the front surface; a back electrode disposed on the back surface; a side printed wire electrically connected to the driving circuit layer, the side printed wire extends to the back electrode from the side surface and is electrically connected to the back electrode, the side printed wire includes a wire top portion located on a side of the driving circuit layer facing away from the base; and a bonding adhesive layer disposed overlying the side of the driving circuit layer facing away from the base, the bonding adhesive layer is further in contact with and covers the wire top portion. The display substrate and the display panel can solve a problem of excessive height in a non-display area.

17 Claims, 3 Drawing Sheets

DISPLAY SUBSTRATE AND DISPLAY PANEL

TECHNICAL FIELD

The disclosure relates to the field of display technologies, and in particular to a display substrate and a display panel.

BACKGROUND

With the rapid development of display technologies, people have higher and higher requirements for display effect. For example, the demand for large screen display or full screen is gradually increasing, which involves an ultra-narrow bezel display. At present, a back bonding technology is an important technology to realize the ultra-narrow bezel display. A display panel generally includes a display area and a non-display area. In a traditional display panel, for a single glass substrate, a signal line layout is only carried out on its front surface (mounting surface of light-emitting devices), in particular a thin film transistor (TFT) circuit (internal driving circuit) is disposed in the display area, while a driving chip (external driving circuit) is disposed in the non-display area around the display area. The back bonding technology can be understood as fabricating a circuit part of the non-display area onto a back surface of the glass substrate, fabricating connection electrodes on the front surface and the back surface of the glass substrate respectively, and connecting the connection electrodes on the both surfaces by printing a metal wire such as silver (Ag) paste on a side surface of the glass substrate, so as to realize the conduction of signal wires on the both surfaces of the glass substrate, which greatly reduces a bezel area on the front surface of the display substrate.

However, there are still some defects in the conventional back bonding technology. Taking a Micro Light Emitting Diode (Micro LED) display panel as an example, in a pressing and bonding process of the Micro LED, due to a side printed metal wire (thickness thereof is generally 4-10 micrometers (μm)) is generally provided with a protective adhesive layer (thickness thereof is generally 4-6 μm), and due to the ultra-narrow bezel design, the bonding adhesive material (thickness thereof is generally 4-8 μm) in the actual production process is unavoidable to cover the protective adhesive layer during attachment, resulting in a highest position of material layer in the non-display area as shown in FIG. 1 (height is 12-24 μm starting from a bottom of the side printed wire) exceeds the height of the top of the transferred Micro LED (height is 10-21 μm starting from the bottom of the side printed wire), which leads to the phenomenon of excessive height in the non-display area. In this way, when a quartz plate is used for pressing, the Micro LED cannot be pressed resulting from the blocking of the portion with excessive height in the non-display area, so that the Micro LED cannot be bonded and lit normally.

Therefore, it is urgent to provide a new display substrate structure to solve the above excessive height problem.

SUMMARY

Therefore, in order to overcome at least some of the defects in the prior art, embodiments of the disclosure provide a display substrate and a display panel, which can reduce the height of the non-display area of the display substrate and thereby ensure good bonding effect.

Specifically, in one aspect, an embodiment of the disclosure provides a display substrate, including: a base, including a front surface, a back surface opposite to the front surface, and a side surface connected between the front surface and the back surface; a driving circuit layer, disposed on the front surface of the base; a back electrode, disposed on the back surface of the base; a side printed wire, electrically connected to the driving circuit layer; the side printed wire extends to the back electrode along the side surface and is electrically connected to the back electrode, and the side printed wire includes a wire top portion located on a side of the driving circuit layer facing away from the base; and a bonding adhesive layer, disposed overlying the side of the driving circuit layer facing away from the base, the bonding adhesive layer is in contact with the side printed wire and covers the wire top portion.

In an embodiment, the side printed wire further includes a wire bottom portion located on a side of the back electrode facing away from the base and a wire side portion connected between the wire top portion and the wire bottom portion; the display substrate further includes: a first protective layer, being in contact with and covering sides of the wire bottom portion and the wire side portion facing away from the base; and the bonding adhesive layer is connected to the first protective layer, and surrounds the side printed wire together with the first protective.

In an embodiment, the first protective layer includes: a side portion, located on a side of the wire side portion facing away from the side surface; and the side portion of the first protective layer includes a first end close to the wire bottom portion and a second end opposite to the first end, the side portion of the first protective layer extends from the first end to the second end in a direction approaching the wire top portion, and a first maximum distance from the second end to the base is not greater than a second maximum distance from the wire top portion to the base.

In an embodiment, the bonding adhesive layer is further in contact with and covers the second end of the side portion of the first protective layer.

In an embodiment, the first maximum distance is equal to the second maximum distance.

In an embodiment, the side printed wire further includes a wire bottom portion located on a side of the back electrode facing away from the base and a wire side portion connected between the wire top portion and the wire bottom portion; and the bonding adhesive layer extends to the side of the back electrode facing away from the base from a side of the wire top portion facing away from the driving circuit layer along the wire side portion and the wire bottom portion, and the bonding adhesive layer is in contact with and covers sides of the wire side portion and the wire bottom portion facing away from the base.

In an embodiment, a number of the back electrode is multiple, a number of the side printed wire is multiple, and the multiple side printed wires are electrically connected to the multiple back electrodes in one-to-one correspondence.

In an embodiment, the driving circuit layer includes: a thin film transistor (TFT) layer, disposed on a side of the base facing away from the back electrode and electrically connected to the wire top portion of the side printed wire; a planarization layer, disposed overlying a side of the TFT layer facing away from the base; and a bonding pad, disposed on a side of the planarization layer facing away from the TFT layer and electrically connected to the TFT layer; the bonding adhesive layer is disposed overlying the planarization layer and covers the bonding pad.

In an embodiment, the display substrate includes a display area and a non-display area surrounding the display area, a number of the bonding pad is multiple and a number of the side printed wire is multiple; the TFT layer includes: multiple pixel driving circuits, located in the display area and respectively electrically connected to the multiple bonding pads; and multiple front electrodes, located in the non-display area and respectively electrically connected to the multiple pixel driving circuits; and the planarization layer covers the multiple pixel driving circuits and exposes the multiple front electrodes, and the wire front portions of the multiple side printed wires are electrically connected to the multiple front electrodes respectively.

In another aspect, an embodiment of the disclosure provides a display panel, including: the display substrate according to the above embodiments; and a micro light-emitting device, disposed on the bonding adhesive layer of the display substrate and electrically connected to the driving circuit layer.

In an embodiment, the display panel further includes: a panel driving circuit, disposed on the back surface of the base and electrically connected to the back electrode; and the panel driving circuit is configured to output driving control signals to the driving circuit layer through the back electrode and the side printed wire to drive the micro light-emitting device.

It can be seen from the above that the above embodiments of the disclosure can achieve one or more of the following beneficial effects: by adopting a structure that the bonding adhesive layer is in contact with and covers the wire top portion, the side printed wire is protected and the height of the non-display area is reduced, which can ensure the bonding effect of the micro light-emitting device and save materials, and the structure is simple.

Through the following detailed description with reference to the attached drawings, other aspects and features of the disclosure become obvious. However, it should be understood that the drawings are only designed for the purpose of explanation, not as a limitation of the scope of the disclosure. It should also be understood that, unless otherwise noted, it is not necessary to draw the drawings to scale, they only attempt to conceptually illustrate the structure and process described herein.

BRIEF DESCRIPTION OF THE DRAWINGS

Embodiments of the disclosure will be described in detail below in combination with the attached drawings.

DESCRIPTION OF REFERENCE NUMERALS

100: display substrate; 101: display area; 102: non-display area; 10: base; 11: front surface; 12: back surface; 13: side surface; 131: first side surface; 132: first chamfer surface; 133: second chamfer surface; 20: driving circuit layer; 21: thin film transistor (TFT) layer; 211: pixel driving circuit; 212: front electrode; 23: planarization layer; 24: bonding pad; 32: back electrode; 40: side printed wire; 41: wire top portion; 42: wire bottom portion; 43: wire side portion; 431: first side portion; 432: first inclined portion; 433: second inclined portion; 50: bonding adhesive layer; 60: first protective layer; 61: side portion of the first protective layer; 611: first end; 612: second end; 300: micro light-emitting device; 400: panel driving circuit.

Detailed Description of the Embodiments

In order to make the above purpose, features and advantages of the disclosure more obvious and easier to understand, the embodiments of the disclosure are described in detail below in combination with the attached drawings.

In order to enable those skilled in the art better understand the technical scheme of the disclosure, the technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protective scope of the disclosure.

It should be noted that the terms "first" and "second" in the description and claims of the disclosure and the above drawings are used to distinguish similar objects, and do not have to be used to describe a specific order or sequence. It should be understood that the terms so used are interchangeable under appropriate circumstances so that the embodiments of the disclosure described herein can be implemented in an order other than those illustrated or described herein. In addition, the terms "including" and "having" and any variations thereof are intended to cover non-exclusive inclusions, for example, processes, methods, systems, products or devices that contain a series of steps or units need not be limited to those clearly listed those steps or units, but may include other steps or units not explicitly listed or inherent to these processes, methods, products or equipment.

It should also be noted that the division of multiple embodiments in the disclosure is only for the convenience of description and should not constitute special restrictions. The features in various embodiments can be combined and quoted from each other without contradiction.

First Embodiment

Figure 1:
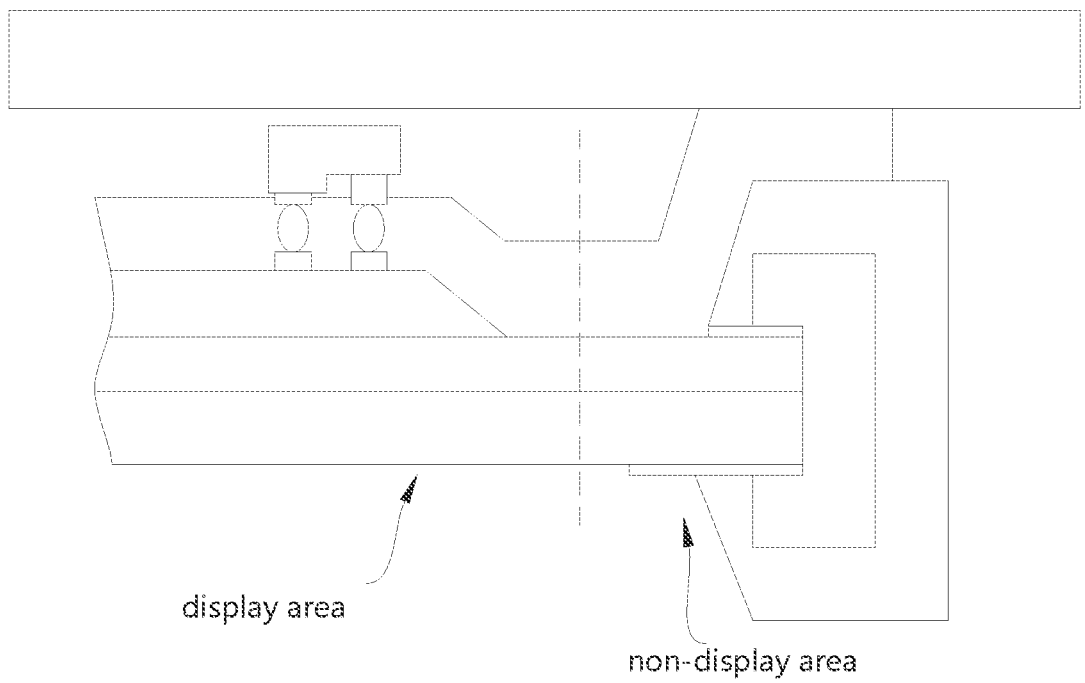
FIG. 1 is a schematic structural view of a display substrate in the prior art.
Figure 2:
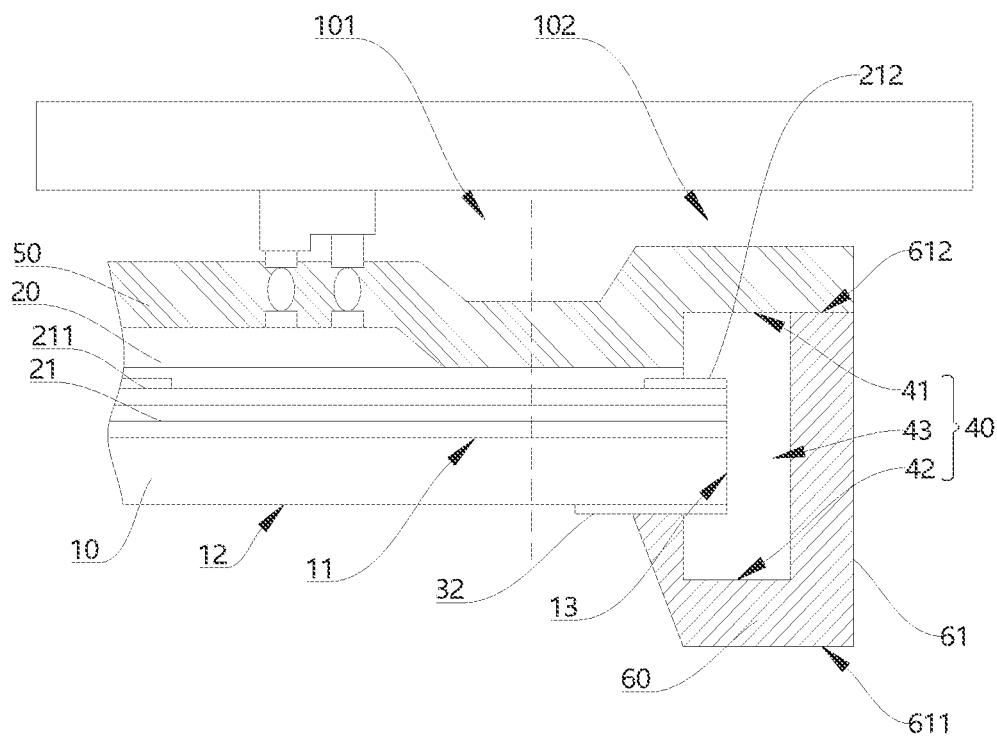
FIG. 2 is a schematic structural view of a display substrate according to an embodiment of the disclosure.

As shown in FIG. 2, the first embodiment of the disclosure provides a display substrate 100. The display substrate 100 includes for example: a base 10, a driving circuit layer 20, a back electrode 32, a side printed wire 40 and a bonding adhesive layer 50.

The base 10 is generally a glass plate, which is an important structure for carrying a display array. The base 10 includes a front surface 11, a back surface 12 opposite to the front surface 11, and a side surface 13 connected between the front surface 11 and the back surface 12. According to an orientation of FIG. 2, an upper surface of the base 10 is the front surface 11, a lower surface of the base 10 is the back surface 12, and a right surface of the base 10 is the side surface 13. Of course, only a part of a cross section of the base 10 is shown in FIG. 2. For example, if the base 10 is a rectangular glass plate, left, front and rear surfaces of the rectangular glass plate not shown in FIG. 2 all can be the side surface 13 of the base 10.

The driving circuit layer 20 is disposed on the front surface 11 of the base 10. The driving circuit layer 20 is configured to drive a micro light-emitting device (such as Micro LED or Mini LED) to emit light. Specifically, the driving circuit layer 20 includes, for example, a thin film transistor (TFT) layer 21, which is disposed on a side of the base 10 facing away from the back electrode 32. The TFT layer 21 includes, for example, a buffer layer, an active layer, a gate insulation layer (GI layer), a first metal layer, a first passivation layer, a second metal layer, a second passivation layer stacked sequentially in that order from the front surface 11 of the base 10. The active layer, the first metal layer and the second metal layer are used to form a TFT device structure. The gate insulation layer, the first passivation layer and the second passivation layer are mainly used for insulation and isolation among the active layer, the first metal layer and the second metal layer. Specifically, the display substrate 100 includes, for example, a display area 101 and a non-display area 102 surrounding the display area 101. The TFT layer 21 further includes multiple pixel driving circuits 211 located in the display area 101. The display area 101 includes, for example, multiple pixel positions. Each of the multiple pixel positions is correspondingly provided with one of the multiple pixel driving circuits 211. More specifically, each pixel driving circuit 211 is formed, for example, by electrically connecting the TFT device mentioned above with a storage capacitor and other structures according to a certain connection mode, as an internal driving circuit of the display substrate 100. The TFT layer 21 further includes, for example, the front electrode 212 located in the non-display area 102. A number of the front electrode 212 may be multiple. The multiple front electrodes 212 correspond to the multiple pixel driving circuits 211 one by one, and the multiple front electrodes 212 are electrically connected to the multiple pixel driving circuits 211 respectively. Specifically, the front electrode 212 is electrically connected to the pixel driving circuit 211, for example, through a lead in the driving circuit layer 20. The front electrode 212 is disposed on the side of the TFT layer 21 facing away from the base 10. Specifically, for example, the front electrode 212 is disposed on the first passivation layer. Thus, the multiple front electrodes 212 can be configured to transmit inputted driving control signals to the multiple pixel driving circuits 211 to drive the display of the multiple micro light emitting devices corresponding to the multiple pixel positions respectively. In an embodiment, the driving circuit layer 20 further includes a planarization layer 23 and a bonding pad 24. The planarization layer 23 is disposed overlying the side of the TFT layer 21 facing away from the base 10. The bonding pad 24 is disposed on the side of the planarization layer 23 facing away from the TFT layer 21 and electrically connected to the TFT layer 21. A number of the bonding pad 24 is multiple, and each bonding pad 24 is configured to bond corresponding one of the multiple micro light-emitting devices. Each bonding pad 24 is electrically connected to corresponding one of the multiple pixel driving circuits 211. Each bonding pad 24 includes a pair of pads or contacts. The planarization layer 23 specifically covers sides of the multiple pixel driving circuits 211 facing away from the base 10, and a part of the planarization layer 23 located in the non-display area 102 is taken away, to expose the multiple front electrodes 212 (if the TFT layer 21 is provided with the second passivation layer, the second passivation layer also needs to be partially taken away to expose the front electrodes 212). The back electrode 32 is disposed on the back surface 12 of the base 10 and corresponds to the front electrode 212. When a number of front electrodes 212 is multiple, a number of back electrodes 32 is also multiple, and the multiple back electrodes 32 correspond to the multiple front electrodes 212 one by one.

The side printed wire 40 is electrically connected to the driving circuit layer 20, and the side printed wire 40 extends along the side surface 13 to the back electrode 32 and is electrically connected to the back electrode 32. Material of the side printed wire 40 can be silver, copper, aluminum and other metal materials, which can be selected according to the actual needs. Specifically, the side printed wire 40 is electrically connected to the driving circuit layer 20 through the front electrode 212. When the number of the front electrode 212 and the back electrode 32 are respectively multiple, a number of the side printed wire 40 is also multiple, and each side printed wire 40 conducts one of the multiple front electrodes 212 and corresponding one of the multiple back electrodes 32. In this way, the back electrode 32 and the front electrode 212 are connected by the corresponding side printed wire 40, and an external panel driving circuit (including a printed circuit board (PCB) and a chip on film (COF) can be bonded to the back electrode 32 on the back surface 12, and driving control signals pass through the back electrode 32, the side printed wire 40 and the front electrode 212 are transmitted to the pixel driving circuit 211 to drive the display of the corresponding bonded micro light-emitting device on the bonding pad 24. In this embodiment, the side printed wire 40 includes a wire top portion 41 located on the side of the front electrode 212 facing away from the base 10. The side printed wire 40 further includes a wire bottom portion 42 and a wire side portion 43. The wire bottom portion 42 is located on the side of the back electrode 32 facing away from the base 10. The wire side portion 43 is connected between the wire top portion 41 and the wire bottom portion 42. Referring to FIG. 2, the side printed wire 40 is, for example, a U-shaped structure, a part of the side printed wire 40 on the upper surface of the front electrode 212 is the wire top portion 41, a part of the side printed wire 40 on the lower surface of the back electrode 23 is the wire bottom portion 42, and a part of the side printed wire 40 on a right side of the base 10 (i.e., on the side surface 13) is the wire side portion 43. It can be understood that the wire top portion 41 can also be understood as the upper surface of the side printed wire 40 in some embodiments, and the wire bottom portion 42 can also be understood as the lower surface of the side printed wire 40.

The bonding adhesive layer 50 is disposed overlying the side of the driving circuit layer 20 facing away from the base 10. The bonding adhesive layer 50 is further in contact with the side printed wire 40 and covers the wire top portion 41. The bonding adhesive layer 50 is configured to bond the micro light-emitting device to the display substrate 100. The bonding adhesive layer 50 specifically is disposed overlying the planarization layer 23 and covers the bonding pad 24. Specifically, the bonding adhesive layer 50 is configured to bond the micro light-emitting device to the bonding pad 24. Specifically, the bonding adhesive layer 50 is, for example, anisotropic conductive film (ACF) adhesive. The ACF adhesive is composed of colloid and conductive gold balls. The conductive gold balls are dispersed in the flake colloid. After transferring the micro light-emitting device such as the Micro LED to a surface of the colloid, by pressing the Micro LED, electrode of the Micro LED can be connected to the bonding pad 24 through the conductive golden ball particles, so as to realize the bonding of the Micro LED. Of course, the above is just an example. The bonding adhesive layer 50 can also use other adhesive materials with function of bonding the micro light-emitting device, such as non-conductive film (NCF) adhesive. In this embodiment, the bonding adhesive layer 50 is in contact with and covers the wire top portion 41. Referring to FIG. 2, that is, the bonding adhesive layer 50 directly covers the upper surface of the side printed wire 40. In an embodiment, the bonding adhesive layer 50 is an integral adhesive material, which can cover the wire top portions 41 of the multiple side printed wires 40 as a whole. In this embodiment, since the bonding adhesive layer 50 directly covers the wire top portion 41 and there are no other material layers in the middle, the height of the material layer of the non-display area 102 is significantly reduced. As shown in FIG. 2, when another plate is used to press the micro light-emitting device, the highest position of the non-display area 102 will not exceed the height of the top of the micro light-emitting device. Therefore, the micro light-emitting device will not be blocked in the pressing process, which ensures the bonding effect of the micro light-emitting device. At the same time, the setting of the bonding adhesive layer 50 cannot only realize the bonding of the micro light-emitting device, but also effectively protect the side printed wire 40, realizing the effect of one object with multiple uses; and the whole adhesive material is adopted, and the operation is simple.

Second Embodiment

The second embodiment of the disclosure provides a display substrate 100. Based on the display substrate 100 provided by the first embodiment, referring to FIG. 2, the display substrate 100 further includes a first protective layer 60. The first protective layer 60 is in contact with and covers sides of the wire bottom portion 42 and the wire side portion 43 facing away from the base 10. The bonding adhesive layer 50 is connected to the first protective layer 60 and surrounds the side printed wire 40 together with the first protective layer 60. According to the orientation shown in FIG. 2, the first protective layer 60 is directly in contact with and covers the right outer surface of the side printed wire 40, also covers the lower surface of the side printed wire 40 and a left surface adjacent to the lower surface of the side printed wire 40, while the bonding adhesive layer 50 covers the upper surface of the side printed wire 40 and a left surface adjacent to the upper surface of the side printed wire 40. The side printed wire 40 is surrounded by the bonding adhesive layer 50 and the first protective layer 60. The first protective layer 60 includes a colloidal material, such as epoxy resin, silica gel, acrylic resin, or inorganic insulating material, which is configured to prevent the side printed wire 40 from being damaged during processing. In this embodiment, the wire top portion 41 is covered by the bonding adhesive layer 50, while the wire bottom portion 42 and the wire side portion 43 are covered by the first protective layer 60. The bonding adhesive layer 50 and the first protective layer 60 are combined to realize the comprehensive coverage protection of the side printed wire 40.

Figure 3:
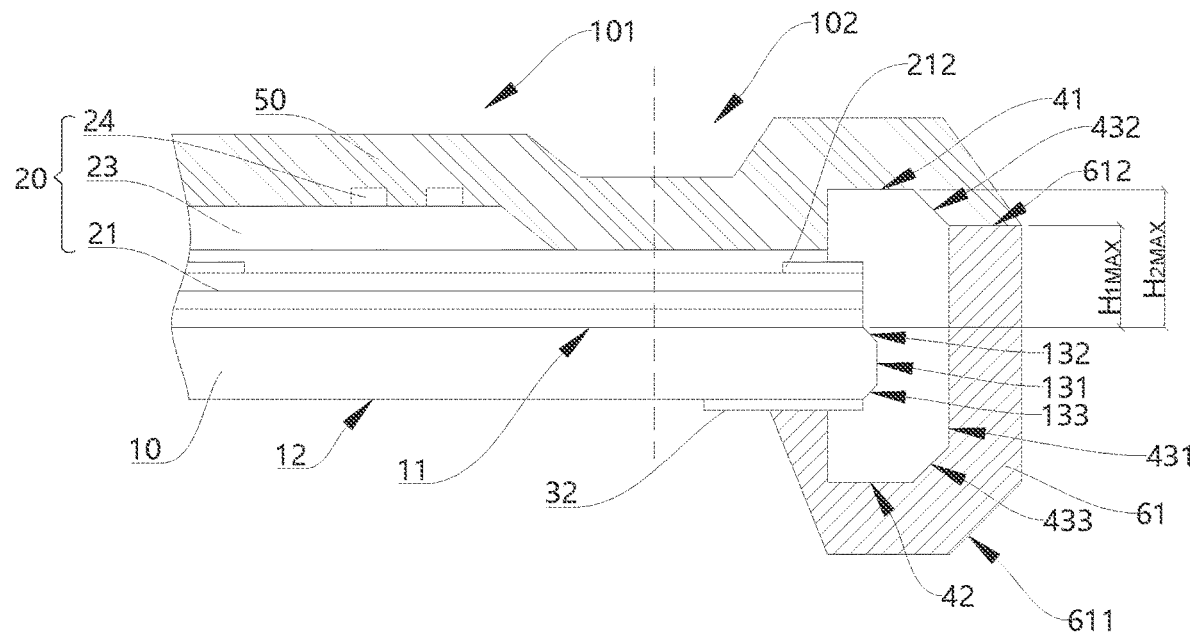
FIG. 3 is a schematic structural view of a display substrate according to an embodiment of the disclosure.

In an embodiment, the first protective layer 60 specifically includes a side portion 61 of the first protective layer, which is located on a side of the wire side portion 43 facing away from the side surface 13. The side portion 61 of the first protective layer includes a first end 611 close to the wire bottom portion 42 and a second end 612 opposite to the first end. The side portion 61 of the first protective layer extends from the first end 611 to the second end 612 in a direction approaching the wire top portion 41. A first maximum distance $H_{1MAX}$ from the second end 612 to the base 10 is not greater than a second maximum distance $H_{2MAX}$ from the wire top portion 41 to the base 10. In an embodiment, the bonding adhesive layer 50 further covers the second end 612 of the side portion 61 of the first protective layer. Referring to FIG. 2, the side portion 61 of the first protective layer refers to a part located on a right side of the wire side portion 43, the first end 611 is located at a lower end of the side portion 61 of the first protective layer, and the second end 612 is located at an upper end of the side portion 61 of the first protective layer opposite to the first end 611. The side portion 61 of the first protective layer can be regarded as starting from the first end 611 and extending along an outer surface of the wire side portion 43 to the second end 612. Referring to FIG. 3, the first maximum distance $H_{1MAX}$ from the second end 612 to the base 10 refers to a distance from a highest point of the second end 612 to the upper surface of the base 10 according to an orientation of FIG. 3 (i.e., taking the upper surface of the base 10 as the reference plane), and the second maximum distance $H_{2MAX}$ from the wire top portion 41 to the base 10 refers to a distance from a highest point of the wire top portion 41 to the upper surface of the base 10. Of course, the aforementioned distances to the base 10 can also be referred to the back surface 12 of the base 10, so the second end 612 and the wire top portion 41 are referred to the back surface 12. Among them, the first maximum distance $H_{1MAX}$ and the second maximum distance $H_{2MAX}$ can also be calculated with reference to other positions on the base 10. If a position point on the base 10 is used as a reference, the first maximum distance $H_{1MAX}$ should be a vertical distance (i.e., taking the orientation of FIG. 3 as an example, i.e. the vertical height) from the highest point of the second end 612 to a reference point. The second maximum distance $H_{2MAX}$ should be the vertical distance from the highest point of the wire top portion 41 to the reference point, as long as the reference positions of the second end 612 and the wire top portion 41 are the same. Moreover, the first maximum distance $H_{1MAX}$ can be negative. For example, taking the front surface 11 as the reference, the second end 612 is lower than the front surface 11. The first maximum distance $H_{1MAX}$ is negative, which still satisfies that the first maximum distance $H_{1MAX}$ is less than the second maximum distance $H_{2MAX}$. That is, according to the orientation shown in FIG. 2 or FIG. 3, the highest point of the second end 612 does not exceed the highest point of the upper surface of the wire top portion 41. Then, for example, referring to FIG. 2, the wire top portion 41 is parallel to the front surface 11 of the base 10, and the second end 612 of the side portion 61 of the first protective layer is flush with the wire top portion 41, then the first maximum distance $H_{1MAX}$ is equal to the second maximum distance $H_{2MAX}$. Of course, for example, if the wire top portion 41 is not parallel to the front surface 11 of the base 10, the first maximum distance $H_{1MAX}$ can also be equal to the second maximum distance $H_{2MAX}$. That is, according to the orientations of FIG. 2 and FIG. 3, the highest point of the second end 612 does not exceed the highest point of the wire top portion 41.

Referring to FIG. 3, the base 10 has chamfers, for example, and the side surface 13 further includes a first side surface 131, a first chamfer surface 132 connected between the first side surface 131 and the front surface 11, and a second chamfer surface 133 connected between the first side surface 131 and the back surface 12. The wire side portion 43 further includes a first side portion 431 located on the first side surface 131, a first inclined portion 432 connected between the first side portion 431 and the wire top portion 41, and a second inclined portion 433 connected between the first side portion 431 and the wire bottom portion 42. The first maximum distance from the second end 612 to the base 10 is, for example, not greater than the distance from an adjacent edge of the first inclined portion 432 and the wire top portion 41 to the base 10.

Third Embodiment

Figure 4:
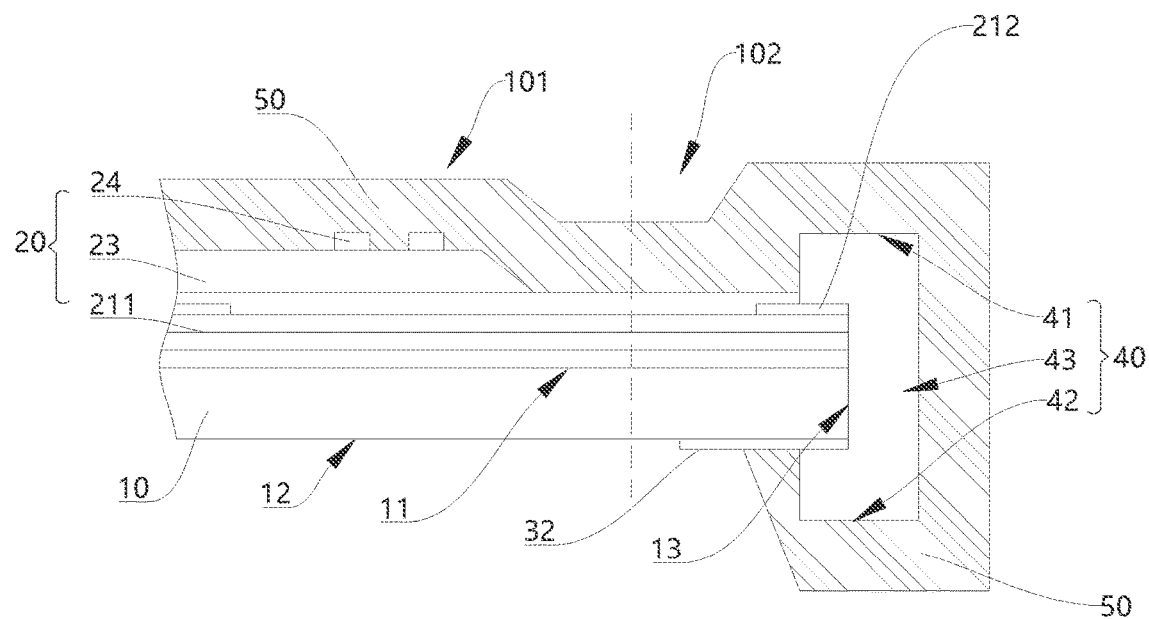
FIG. 4 is a schematic structural view of a display substrate according to an embodiment of the disclosure.

The third embodiment of the disclosure provides another display substrate 100. Based on the display substrate 100 provided in the first embodiment, referring to FIG. 4, the bonding adhesive layer 50 extends from the side of the wire top portion 41 facing away from the driving circuit layer 20 to the side of the back electrode 32 facing away from the base 10, and the bonding adhesive layer 50 is in contact with and covers sides of the wire side portion 43 and the wire bottom portion 42 facing away from the base 10. As shown in FIG. 4, the bonding adhesive layer 50 directly extends from an upper side of the display substrate 100 along a right side to a lower side of the display substrate 100. Specifically, the bonding adhesive layer 50 includes an integral adhesive material, which can not only be used for the bonding of the micro light-emitting device, but also form a comprehensive coverage protection for the side printed wire 40, realizing the effect of one object with multiple uses. In the preparation process of the display substrate 100, the setting of the protective adhesive layer is omitted compared with the traditional display substrate, which can further save the use of materials and manufacturing processes.

Figure 5:
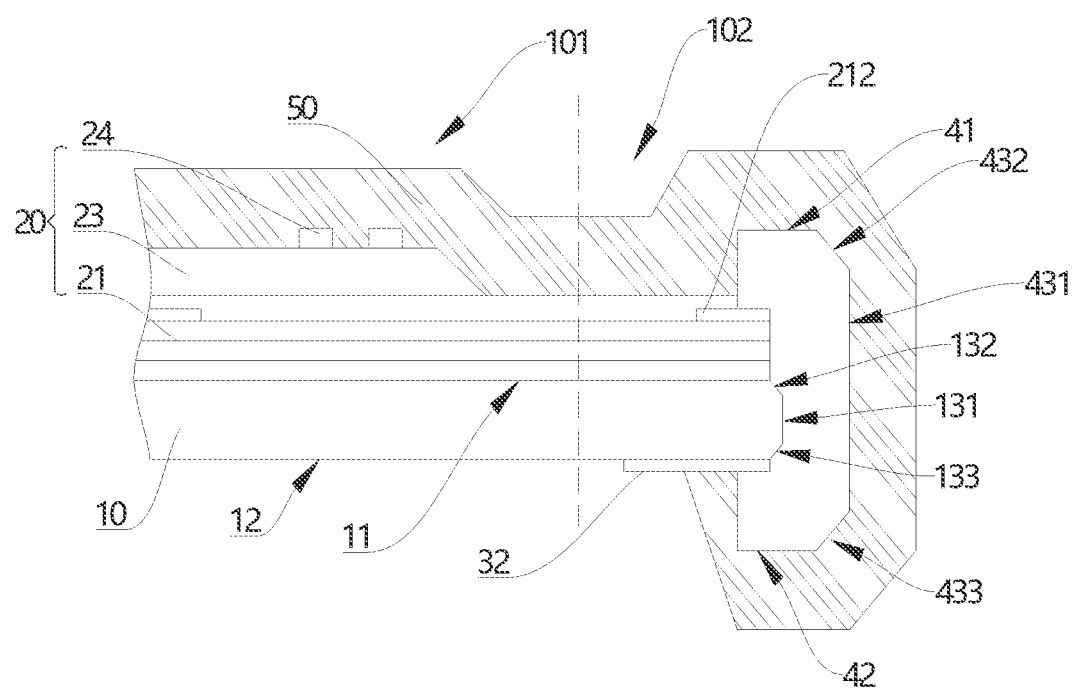
FIG. 5 is a schematic structural view of a display substrate according to an embodiment of the disclosure.

In an embodiment, referring to FIG. 5, the base 10 has chamfers, for example, and the side surface 13 further includes a first side surface 131, a first chamfer surface 132 connected between the first side surface 131 and the front surface 11, and a second chamfered surface 133 connected between the first side surface 131 and the back surface 12. The wire side portion 43 further includes a first side portion 431 located on the first side surface 131, a first inclined portion 432 connected between the first side portion 431 and the wire top portion 41, and a second inclined portion 433 connected between the first side portion 431 and the wire bottom portion 42. It can prevent the sharp corner from damaging the bonding adhesive layer 50.

Fourth Embodiment

Figure 6:
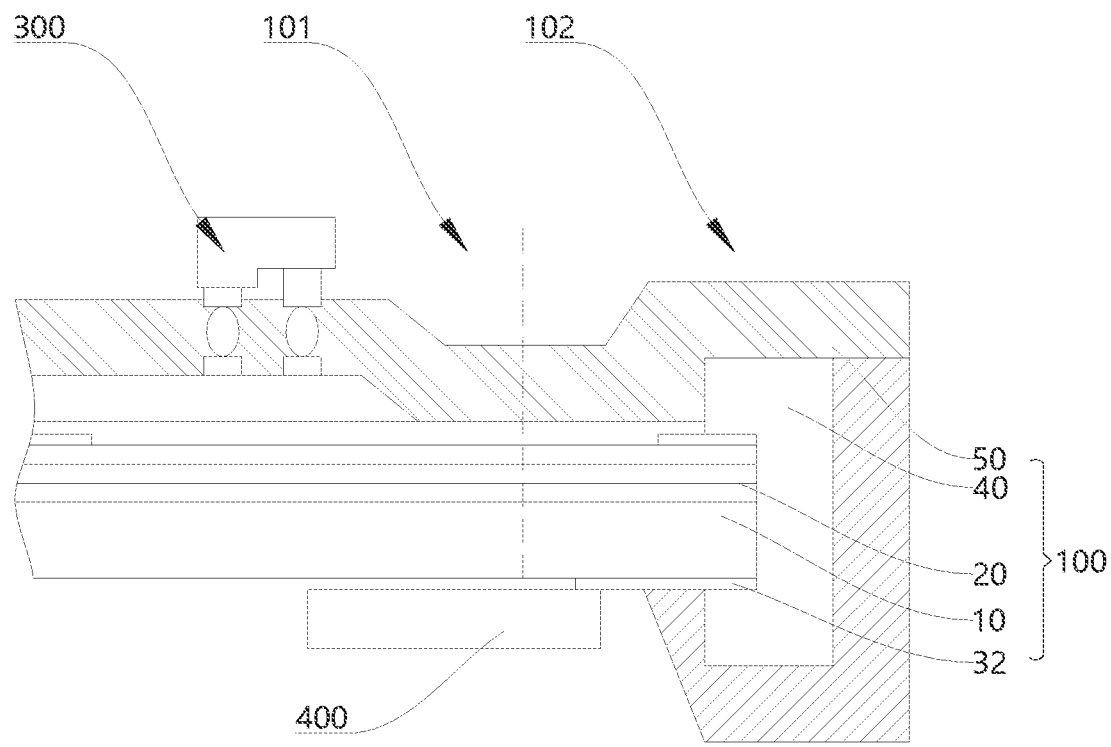
FIG. 6 is a schematic structural view of a display panel according to an embodiment of the disclosure.

The fourth embodiment of the disclosure provides a display panel. Referring to FIG. 6, the display panel includes any one of the display substrates 100 in the first embodiment, the second embodiment and the third embodiment, and further includes a micro light-emitting device 300, which is disposed on the bonding adhesive layer 50 of the display substrate 100 and electrically connected to the pixel driving circuit 211 of the driving circuit layer 20. The embodiment does not limit the number of the micro light-emitting device 300 to one in FIG. 6. Specifically, the micro light-emitting device 300 is bonded to the bonding pad 24 of the display substrate 100 by the bonding adhesive layer 50, and driving control signals are transmitted to the pixel driving circuit 211 of the driving circuit layer 20 through the back electrode 32, the side printed wire 40 and the front electrode 212 to drive the display of the micro light-emitting device 300. Specifically, the display panel further includes a panel driving circuit 400, which is disposed on the back surface 12 of the base 10 and electrically connected to the back electrode 32. The panel driving circuit 400 includes, for example, the COF and the driving circuit board such as the PCB for outputting the driving control signals to the driving circuit layer 20 to drive the micro light-emitting device 300 (e.g., Micro LED) to emit light. The display panel provided by this embodiment adopts the display substrate 100 in the above embodiments, so it has the same beneficial effects as the above display substrate 100.

The above description is only the illustrated embodiments of the disclosure, and does not limit the disclosure in any form. Although the disclosure has been disclosed in the above embodiments, it is not intended to limit the disclosure. Any person skilled in the art can make some amendments or modifications as equivalent embodiments according to the above disclosed technical contents without departing from the technical scope of the disclosure. As long as they are without departing from the technical scope of the disclosure, any simple amendments, equivalent changes and modifications to the above embodiments according to the technical essence of the disclosure are still within the technical scope of the disclosure.

What is claimed is:

1. A display substrate, comprising:
   a base, comprising a front surface, a back surface opposite to the front surface, and a side surface connected between the front surface and the back surface;
   a driving circuit layer, disposed on the front surface of the base;
   a back electrode, disposed on the back surface of the base;
   a side printed wire, electrically connected to the driving circuit layer; wherein the side printed wire extends to the back electrode along the side surface and is electrically connected to the back electrode, and the side printed wire comprises a wire top portion located on a side of the driving circuit layer facing away from the base; and
   a bonding adhesive layer, disposed overlying the side of the driving circuit layer facing away from the base, wherein the bonding adhesive layer is in contact with the side printed wire and covers the wire top portion;
   wherein the driving circuit layer comprises:
      a thin film transistor (TFT) layer, disposed on a side of the base facing away from the back electrode and electrically connected to the wire top portion of the side printed wire;
      a planarization layer, disposed overlying a side of the TFT layer facing away from the base; and
      a bonding pad, disposed on a side of the planarization layer facing away from the TFT layer and electrically connected to the TFT layer; wherein the bonding adhesive layer is disposed overlying the planarization layer and covers the bonding pad.

2. The display substrate according to claim 1, wherein the side printed wire further comprises a wire bottom portion located on a side of the back electrode facing away from the base and a wire side portion connected between the wire top portion and the wire bottom portion;
   wherein the display substrate further comprises: a first protective layer, being in contact with and covering sides of the wire bottom portion and the wire side portion facing away from the base; and
   wherein the bonding adhesive layer is connected to the first protective layer, and surrounds the side printed wire together with the first protective layer.

3. The display substrate according to claim 2, wherein the first protective layer comprises: a side portion, located on a side of the wire side portion facing away from the side surface; and
   wherein the side portion of the first protective layer comprises a first end close to the wire bottom portion and a second end opposite to the first end, the side portion of the first protective layer extends from the first end to the second end in a direction approaching the wire top portion, and a first maximum distance from the second end to the base is not greater than a second maximum distance from the wire top portion to the base.

4. The display substrate according to claim 3, wherein the bonding adhesive layer is further in contact with and covers the second end of the side portion of the first protective layer.

5. The display substrate according to claim 3, wherein the first maximum distance is equal to the second maximum distance.

6. The display substrate according to claim 1, wherein the side printed wire further comprises a wire bottom portion located on a side of the back electrode facing away from the base and a wire side portion connected between the wire top portion and the wire bottom portion; and wherein the bonding adhesive layer extends to the side of the back electrode facing away from the base from a side of the wire top portion facing away from the driving circuit layer along the wire side portion and the wire bottom portion, and the bonding adhesive layer is in contact with and covers sides of the wire side portion and the wire bottom portion facing away from the base.

7. The display substrate according to claim 1, wherein a number of the back electrode is multiple, a number of the side printed wire is multiple, and the multiple side printed wires are electrically connected to the multiple back electrodes in one-to-one correspondence.

8. The display substrate according to claim 1, wherein the display substrate comprises a display area and a non-display area surrounding the display area, a number of the bonding pad is multiple and a number of the side printed wire is multiple;

wherein the TFT layer comprises:
multiple pixel driving circuits, located in the display area and respectively electrically connected to the multiple bonding pads; and
multiple front electrodes, located in the non-display area and respectively electrically connected to the multiple pixel driving circuits; and
wherein the planarization layer covers the multiple pixel driving circuits and exposes the multiple front electrodes, and the wire top portions of the multiple side printed wires are electrically connected to the multiple front electrodes respectively.

9. A display panel, comprising:
the display substrate according to claim 1; and
a micro light-emitting device, disposed on the bonding adhesive layer of the display substrate and electrically connected to the driving circuit layer.

10. The display panel according to claim 9, wherein the display panel further comprises:
a panel driving circuit, disposed on the back surface of the base and electrically connected to the back electrode; and
wherein the panel driving circuit is configured to output driving control signals to the driving circuit layer through the back electrode and the side printed wire to drive the micro light-emitting device.

11. The display panel according to claim 9, wherein the side printed wire further comprises a wire bottom portion located on a side of the back electrode facing away from the base and a wire side portion connected between the wire top portion and the wire bottom portion;

wherein the display substrate further comprises: a first protective layer, being in contact with and covering sides of the wire bottom portion and the wire side portion facing away from the base; and wherein the bonding adhesive layer is connected to the first protective layer, and surrounds the side printed wire together with the first protective layer.

12. The display panel according to claim 11, wherein the first protective layer comprises: a side portion, located on a side of the wire side portion facing away from the side surface; and wherein the side portion of the first protective layer comprises a first end close to the wire bottom portion and a second end opposite to the first end, the side portion of the first protective layer extends from the first end to the second end in a direction approaching the wire top portion, and a first maximum distance from the second end to the base is not greater than a second maximum distance from the wire top portion to the base.

13. The display panel according to claim 12, wherein the bonding adhesive layer is further in contact with and covers the second end of the side portion of the first protective layer.

14. The display panel according to claim 12, wherein the first maximum distance is equal to the second maximum distance.

15. The display panel according to claim 9, wherein the side printed wire further comprises a wire bottom portion located on a side of the back electrode facing away from the base and a wire side portion connected between the wire top portion and the wire bottom portion; and wherein the bonding adhesive layer extends to the side of the back electrode facing away from the base from a side of the wire top portion facing away from the driving circuit layer along the wire side portion and the wire bottom portion, and the bonding adhesive layer is in contact with and covers sides of the wire side portion and the wire bottom portion facing away from the base.

16. The display panel according to claim 9, wherein a number of the back electrode is multiple, a number of the side printed wire is multiple, and the multiple side printed wires are electrically connected to the multiple back electrodes in one-to-one correspondence.

17. The display panel according to claim 9, wherein the display substrate comprises a display area and a non-display area surrounding the display area, a number of the bonding pad is multiple and a number of the side printed wire is multiple;

wherein the TFT layer comprises:
multiple pixel driving circuits, located in the display area and respectively electrically connected to the multiple bonding pads; and
multiple front electrodes, located in the non-display area and respectively electrically connected to the multiple pixel driving circuits; and
wherein the planarization layer covers the multiple pixel driving circuits and exposes the multiple front electrodes, and the wire top portions of the multiple side printed wires are electrically connected to the multiple front electrodes respectively.

* * * * *